INVENTOR.
SEENING YEE
BY
ATTORNEY

INVENTOR.
SEENING YEE
BY
ATTORNEY

United States Patent Office 3,418,589

Patented Dec. 24, 1968

3,418,589

COMPLEMENTARY EMITTER FOLLOWER AMPLIFIER BIASED FOR CLASS A OPERATION

Seening Yee, Whitestone, N.Y., assignor to Sperry Rand Corporation, a corporation of Delaware Filed Oct. 6, 1965, Ser. No. 493,384
4 Claims. (Cl. 330—13)

ABSTRACT OF THE DISCLOSURE

An amplifier includes input and output stages, each containing a pair of complementary transistors arranged in emitter follower configurations. The input stage is biased to operate in the Class A mode and the base-to-emitter voltage of this stage is used as the emitter-to-base bias for the output stage.

The invention herein described was made in the course of or under a contract or subcontract thereunder, with the Department of the Navy.

This invention relates to electronic amplifiers and more specifically to push-pull transistor amplifiers.

Electronic amplifiers are often required to drive a low impedance load, and transistorized push-pull emitter follower circuits are frequently used for such purposes.

In many conventional amplifiers of this type, however, considerable distortion occurs in the output wave because the amplifier displays a marked increase in internal impedance for low amplitude signals.

Furthermore, many of these prior art amplifiers are limited to operation in a relatively low range of frequencies.

It is an object of the present invention to provide an amplifier that can drive a low impedance load with negligible distortion.

It is another object of the present invention to provide a low output impedance amplifier that is usable throughout a wide range of frequencies.

These and other objects are achieved by providing an emitter follower, push-pull transistor amplifier in which an input stage is biased for class A operation and the base-to-emitter voltages of the transistors in the input stage are used to bias the transistors in an output stage.

The principles and operation of the invention may be understood by referring to the following description and the accompanying drawings.

Figure 1:
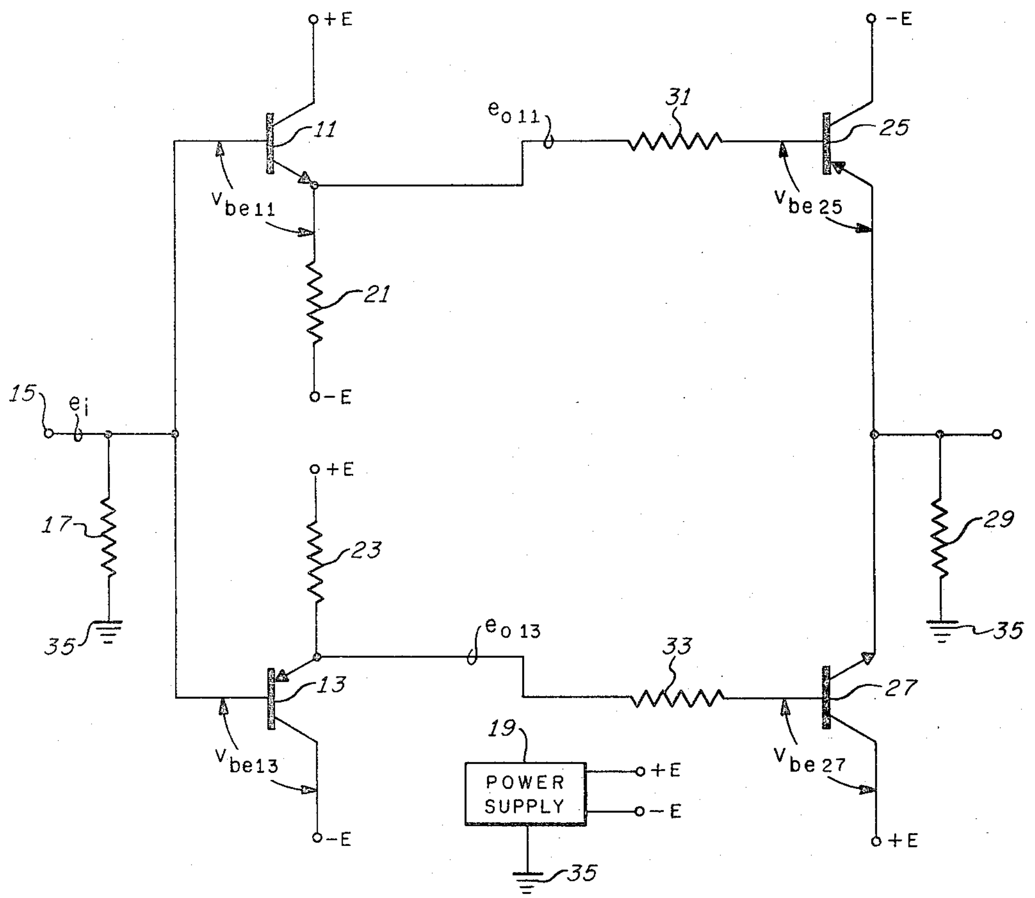
Figure 2:
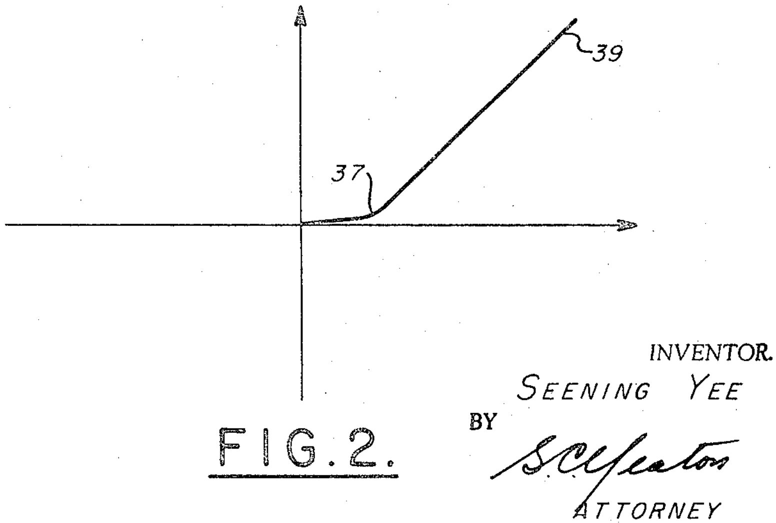
Figure 3:
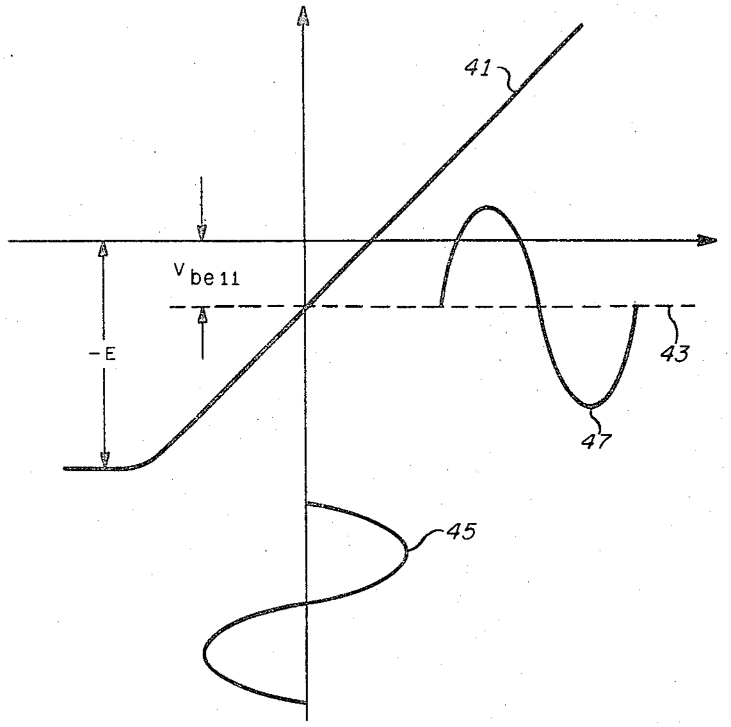
Figure 4:
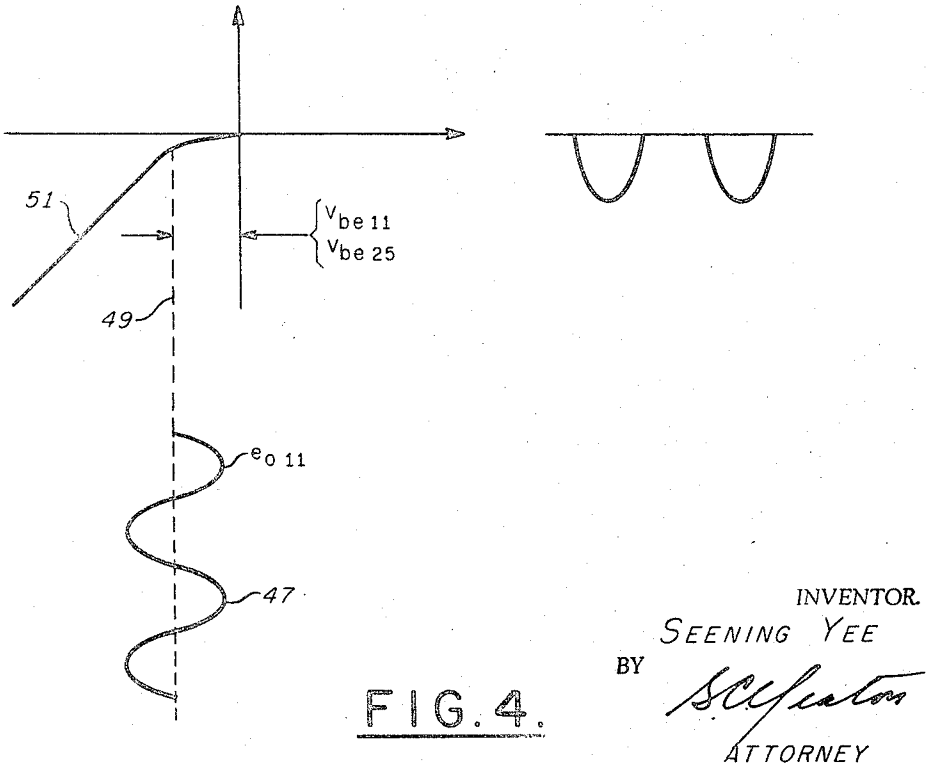

FIG. 1 is a circuit diagram illustrating a presently preferred embodiment of the invention, and FIGS. 2–4 are graphs useful in explaining the operation of the circuit of FIG. 1.

In FIG. 1, a pair of complementary symmetry input transistors 11 and 13 are connected in emitter follower circuits. An input signal applied to an input terminal 15 appears across an input resistor 17 and at the bases of the transistors 11 and 13. A suitable voltage is applied to the collector terminals of the transistors 11 and 13 from a power supply 19. The emitter terminal of the transistor 11 is supplied with a suitable voltage from the source 19 through an emitter resistor 21. Similarly, the emitter terminal of the transistor 13 is supplied with a suitable voltage from the supply 19 through an emitter resistor 23.

A pair of complementary symmetry output transistors 25 and 27 are used to drive a load represented as a resistor 29. The load 29 is connected directly to the emitter terminals of both output transistors. The collector terminals of the output transistors are connected to suitable voltages from the source 19.

The base terminal of the transistor 25 is connected to the emitter terminal of the transistor 11 through a stabilizing resistor 31. The transistors 11 and 25 are of the opposite conductivity types. Similarly, the base terminal of the transistor 27 is connected to the emitter terminal of the transistor 13 through a stabilizing resistor 33. The transistors 13 and 27 are of the opposite conductivity types.

The base terminals of the input transistors are returned to a ground point 35 through the input resistor 17. Since the base current from the transistor 13 tends to flow to ground through the input resistor and the base current of the transistor 11 tends to flow from ground to the transistor, the net base current flowing in the input resistor is substantially zero in the absence of an input signal. This establishes a zero level quiescent base voltage for the input transistors.

The power supply 19 is also connected to the ground point 35 and all of the output voltages from this supply are referred to ground.

The voltage supplied by the power supply 19 to the collector and emitter terminals of the input transistors are adjusted so that the input transistors will operate as class A amplifiers. This is accomplished by providing emitter voltages to the transistors 11 and 13 which are sufficiently below and above ground level, respectively, to bias these transistors well into the linear portion of their characteristic curves so that these transistors draw collector current in the presence of any input signal of either polarity within the desired amplitude range.

The output voltages appearing at the emitter terminals of the transistors 11 and 13 will be held at a quiescent level that differs from ground potential by an amount equal to the base-to-emitter voltage drop $V_{be11}$ and $V_{be13}$ occurring in the respective transistors.

Thus the quiescent base voltage appearing at the transistor 25 will be maintained at a level below ground potential by an amount substantially equal to the base-to-emitter voltage $V_{be11}$ of the transistor 11. Similarly, the quiescent base voltage appearing at the transistor 27 will be maintained at a level above ground potential by an amount equal to the base-to-emitter voltage drop $V_{be13}$ of the transistor 13.

The emitter currents of the transistors 25 and 27 tend to cancel in the output resistor 29. Thus the emitters of these transistors are maintained at a quiescent voltage substantially equal to ground potential. The collector terminlas of the output transistors 25 and 27 are connected to the appropriate terminals on the power supply 19.

The stabilizing resistors 31 and 33 are not essential to the operation of the circuit, although their use is desirable in a practice circuit in order to compensate for slight differences in the characteristics of the transistors. These resistors tend to maintain the quiescent emitter voltages of the output transistors at substantially ground potential even though these transistors are not perfectly matched.

The basic problem which the circuit of the invention is intended to overcome can be understood by referring to FIG. 2. This figure represents the transfer characteristics of a typical NPN transistor when connected in an emitter follower circuit. In the graph of FIG. 2, the input or base voltage of such a transistor is plotted along the horizontal axis and the resulting emitter voltage output is plotted along the vertical axis.

As the base voltage is raised from zero level, no change in emitter voltage is experienced until the instep region 37 is reached. The instep region of the characteristic curve is typically a sharp transition. As the base voltage is increased beyond the instep region, the transistor is driven into the linear region of its characteristic 39 and the emitter voltage changes linearly with respect to the base voltage.

The region of the characteristic curve below the instep 37 acts as a dead zone in which an input voltage produces no corresponding output voltage. Because of the dead zone, small amplitude signals are suppressed and larger amplitude signals are distorted.

FIG. 3 represents the conditions obtaining in the input transistor 11 of the circuit of FIG. 1. The horizontal axis represents ground potential in the output circuit of the transistor. The transfer characteristic curve 41 is displaced below the horizontal axis by an amount equal to the —E voltage available from the supply 19. The vertical axis represents ground potential in the input circuit of the transistor 11. The transistor output voltage appears at the emitter terminal of the transistor, and with no input signal, the output voltage appears at a quiescent level represented by the dashed line 43. Since the base of the transistor is at ground potential in the absence of an input signal, the quiescent level represented by the dashed line 43 is below the horizontal axis by an amount equal to the base-to-emitter voltage drop $V_{be11}$ in the transistor.

When an input signal 45 is applied to the transistor, this signal varies above and below ground potential as indicated in FIG. 3. The corresponding transistor output voltage 47, however, varies above and below the quiescent level 43.

It will be remembered that the emitter voltage of the transistor 25 is also maintained at substantially ground potential. Therefore when the signal from the transistor 11 is applied to the base of the transistor 25, the quiescent base voltage of the output transistor will be displaced from the quiescent emitter voltage of this transistor by an amount equal to the base-to-emitter drop in the input transistor 11. This displacement will be just sufficient to bias the output transistor 25 to the point where it is on the verge of conduction when no signal is being applied.

This relationship can be visualized by referring to FIG. 4 which represents the transfer characteristic of the output transistor 25. The vertical and horizontal axes in this figure represent ground potential for the base and emitter voltages respectively.

The signal 47 from the transistor 11 varies around a quiescent level depicted as a dashed line 49 in FIG. 4. This level is displaced horizontally from the vertical axis by an amount equal to the base-to-emitter drop of the input transistor 11. Since the absolute magnitude of this voltage drop is substantially equal to the corresponding drop in the output transistor 25, the quiescent level 49 will occur at the instep of the characteristic curve 51 of the output transistor. This transistor will conduct linearly for any base voltage that is negative with respect to the quiescent level 49 but will provide no output for any base voltage that is positive with respect to the quiescent level.

The remaining transistors 13 and 27 in FIG. 1 operate in a similar fashion on the opposite half of each cycle. The output transistor 27 conducts during the half cycle in which the transistor 25 provides no output. Since each of the output transistors conduct for precisely one half cycle, one of the output transistors will begin to conduct at the same instant that the other output transistor ceases to conduct. Since the current flowing through the resistor 29 is equal to the sum of the currents flowing through the two output transistors, the load current will be a faithful reproduction of the input signal applied to the terminal 15.

Each output transistor is biased to the instep of its transfer characteristic so that each of these transistors remains on the verge of conduction when no input signal is applied.

Furthermore, even when a reverse signal voltage is applied to an output transistor so that the transistor would ordinarily be driven far into its cutoff region, the circuit of the invention provides means to maintain the base-to emitter voltage substantially at the instep of the characteristic curve of this transistor.

Consider, for instance, a positive-going input signal $e_1$. This signal will tend to increase conduction in the transistor 11 so as to provide a positive-going signal at the base of the output transistor 25. This would normally drive the output transistor well into its cutoff region. However, this same positive-going input signal also causes an increased conduction in the second output transistor 27. The resulting current flowing through the resistor 29 raises the emitter voltage on the nonconducting output transistor 25. Since the emitter voltage of the output transistors follows the base voltage of the conducting transistor very closely, the base-to-emitter voltage of the nonconducting output transistor remains constant and substantially at the instep of is characteristic curve.

Since an input signal does not have to build up through a dead zone before conduction can begin, and since there is never any large reverse base-to-emitter voltage in the output tarnsistors, the circuit provides a high degree of linearity and excellent high frequency response.

The output impedance of the amplifier can be maintained at a low value. Prior art circuits display a high impedance when the circuits are operating in their dead zones. In the circuit of the invention, however, the elimination of the dead zone automatically eliminates this zone of high impedance.

The foregoing description has been limited to a circuit in which all voltages are returned to ground. However, any other voltage reference point may be used so long as the relative voltage relationships are maintained.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. An amplifier comprising a pair of complementary symmetry input transistors each having base, collector, and emitter electrodes, said transistors being connected in emitter follower configurations; a voltage reference point; first biasing means to bias both input transistors for Class A operation; said first biasing means including means to bias the base electrodes of said input transistors to the voltage level of said reference point; means to apply input signals to the bases of both input transistors in parallel; a pair of complementary symmetry output transistors each having base, collector and emitter electrodes; means to connect the emitter electrodes of the output transistors in parallel; means to connect the emitter electrodes of the output transistors to a common load; second biasing means for biasing the emitter electrodes of the output transistors to the level of said voltage reference point; means interconnecting the emitter electrode of each input transistor and the base electrode of the output transistor of opposite conductivity type so as to maintain the interconnected electrodes at substantially the same voltage level.

2. An amplifier comprising a pair of complementary symmetry input transistors, each of said transistors being connected in an emitter follower configuration; an input terminal connected to the base electrodes of both input transistors; a voltage reference point; an input resistor connected between said input terminal and said voltage reference point; a voltage source connected to supply collector and emitter currents to said input transistors, said voltage supply providing first and second voltages that are respectively positive and negative in relation to the voltage at said reference point and adjusted to maintain said input transistors in the linear region of their characteristic curves under normal operating conditions; a pair of complementary symmetry ouput transistors, said output transistors having their collectors connected to said voltage source; means to connect the entire output signal at the emitter electrode of each of said input transistors to the base electrode of the output transistor of opposite conductivity type; an output terminal connected to the emitters of both of said output transistors; and means to connect a load between said output terminal and said reference point.

3. An amplifier comprising a pair of complementary symmetry input transistors, each having base, emitter and collector electrodes and each being connected in an emitter follower configuration; an input terminal connected to the base electrodes of both input transistors; a voltage reference point; an input resistor between said input terminal and said voltage reference point; said input terminal and said input resistor being the only means for supplying base current to said input transistors; means to bias the input transistors for Class A operation; a pair of complementary symmetry output transistors; an output terminal connected directly to the emitter electrodes of both output transistors; means to connect a load impedance between said output terminal and said voltage reference point; and means to connect the entire output signal at the emitter electrode of each input transistor to the base electrode of the output transistor of opposite conductivity type.

4. An amplifier comprising a PNP and an NPN input transistor; a PNP and an NPN output transistor, each of said transistors having collector, base, and emitter terminals; a voltage reference point; an electrical conductor interconnecting the base terminals of the input transistors; an input terminal connected directly to said electrical conductor; an input resistor connected directly between said electrical conductor and the reference point; said electrical conductor being connected only to said base terminals, said input terminal and said input resistor whereby the net base current of said input transistors is equal to the algebraic sum of the current through said input terminal and said input resistor; emitter resistors connected to the emitter terminals of each input transistor; a power supply connected to the collector of each input transistor and said emitter resistors, said power supply being coupled to said voltage reference point so that the voltage of the reference point is intermediate the voltages at the terminals of the power supply, said power supply and said emitter resistors being adjusted to operate the input transistors in the Class A mode of operation, a first stabilizing resistor connected between the emitter terminal of the NPN input transistor and the base terminal of the PNP output transistor; a second stabilizing resistor connected between the emitter terminal of the PNP input transistor and the base terminal of the NPN output transistor; each of said input transistors further having their respective emitter terminals connected only to the corresponding emitter resistor and the corresponding stabilizing resistor so that the emitter current in each input transistor is numerically equal to the sum of the currents in the corresponding emitter resistor and the base terminal of the corresponding output transistors; an output resistor connected between the emitter terminals of both output transistors and the voltage reference point; means to connect the power supply to the collector terminals of the output transistor; and means to connect a load across the output resistor.

References Cited

UNITED STATES PATENTS

| | | | |
|---|---|---|---|
| 2,955,257 | 10/1960 | Lindsay | 330—13 |
| 3,262,062 | 7/1966 | Langan | 330—19 |

JOHN KOMINSKI, *Primary Examiner.*

L. J. DAHL, *Assistant Examiner.*

U.S. Cl. X.R.

330—17, 19, 22